United States Patent
Lee et al.

(10) Patent No.: US 7,534,677 B2
(45) Date of Patent: May 19, 2009

(54) METHOD OF FABRICATING A DUAL GATE OXIDE

(75) Inventors: Hyae-ryoung Lee, Yongin-si (KR); Su-gon Bae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 514 days.

(21) Appl. No.: 11/034,865

(22) Filed: Jan. 14, 2005

(65) Prior Publication Data
US 2005/0170575 A1 Aug. 4, 2005

(30) Foreign Application Priority Data
Feb. 3, 2004 (KR) .................. 10-2004-0007005

(51) Int. Cl.
*H01L 21/84* (2006.01)

(52) U.S. Cl. .................. 438/199; 438/232; 438/275; 438/283; 438/286; 257/E21.205; 257/E21.296; 257/E21.443; 257/E21.632; 257/E21.634; 257/E27.062; 257/E27.112; 257/E29.028; 257/E29.135

(58) Field of Classification Search .......... 438/199, 438/216, 217, 232, 275, 276, 279, 283, 286, 438/981; 257/E21.205, 206, 296, 345, 424, 257/434, 443, 632, 634, 638, 703, E27.062, 257/112, E29.28, 135
See application file for complete search history.

(56) References Cited

U.S. PATENT DOCUMENTS

| | | | | |
|---|---|---|---|---|
| 5,440,161 A * | 8/1995 | Iwamatsu et al. | .......... | 257/349 |
| 5,734,185 A * | 3/1998 | Iguchi et al. | .......... | 257/336 |
| 5,795,803 A * | 8/1998 | Takamura et al. | .......... | 438/228 |
| 5,851,922 A * | 12/1998 | Bevk et al. | .......... | 438/655 |
| 6,060,345 A * | 5/2000 | Hause et al. | .......... | 438/199 |
| 6,100,141 A * | 8/2000 | Hsu | .......... | 438/283 |
| 6,121,124 A * | 9/2000 | Liu | .......... | 438/587 |
| 6,171,911 B1 * | 1/2001 | Yu | .......... | 438/275 |
| 6,174,775 B1 * | 1/2001 | Liaw | .......... | 438/283 |
| 6,268,250 B1 * | 7/2001 | Helm | .......... | 438/275 |
| 6,403,425 B1 * | 6/2002 | Ang et al. | .......... | 438/283 |
| 6,583,013 B1 * | 6/2003 | Rodder et al. | .......... | 438/276 |
| 6,730,555 B2 * | 5/2004 | Kim et al. | .......... | 438/217 |
| 6,897,095 B1 * | 5/2005 | Adetutu et al. | .......... | 438/119 |
| 6,972,224 B2 * | 12/2005 | Gilmer et al. | .......... | 438/199 |

FOREIGN PATENT DOCUMENTS

JP 2000-200836 7/2000
KR 2000-0004483 A 1/2000

* cited by examiner

*Primary Examiner*—Michael S Lebentritt
(74) *Attorney, Agent, or Firm*—Lee & Morse, P.C.

(57) ABSTRACT

A method of fabricating a dual gate oxide of a semiconductor device includes forming a first gate insulation layer over an entire surface of a substrate, removing a portion of the first gate insulation layer to selectively expose a first region of the substrate using a first mask and performing an ion implantation on the selectively exposed first region of the substrate using the first mask, and forming a second gate insulation layer on the first gate insulation layer and the exposed first region of the substrate to form a resultant gate insulation layer having a first thickness over the first region of the substrate and a second thickness over a remaining region of the substrate, the first thickness and the second thickness being different.

19 Claims, 7 Drawing Sheets

METHOD OF FABRICATING A DUAL GATE OXIDE

BACKGROUND OF THE INVENTION

1. Field of the Invention

The present invention relates to a method of fabricating a dual gate oxide of a semiconductor device. More particularly, the present invention relates to a method of forming a resultant gate oxide layer having a varying thickness on a single chip for fabricating a metal oxide semiconductor (MOS) device having different operating voltages.

2. Description of the Related Art

In general, an area of a chip where a thinner gate oxide is formed is used for a peripheral logic circuit requiring a high driving power, and an area of the same chip where a thicker gate oxide is formed is used for a memory cell circuit requiring a high breakdown voltage characteristic.

In order to implement MOS devices driven by different operating voltages in a single chip, rather complex photolithographic etching processes are required. For example, a step of forming gate oxide layers having different thicknesses and a step of selectively implanting impurities for the control of the respective threshold voltages are required.

Thus, as compared to a MOS device driven by a single operating voltage and having a single thickness, photolithographic etching processes are additionally required and masks used therein are necessarily fabricated.

FIGS. 1 through 7 illustrate cross-sectional views of sequential stages in a conventional method of fabricating a dual gate oxide.

A semiconductor substrate 10 for forming a dual gate oxide includes PMOS forming regions 13 and 14 and NMOS forming regions 11 and 12.

The NMOS forming regions 11 and 12 include a first forming region 11, where a thick gate oxide is to be formed, and a second NMOS forming region 12, where a thin gate oxide is to be formed. The PMOS forming regions 13 and 14 include a first PMOS forming region 13, where a thick gate oxide is to be formed, and a second PMOS forming region 14, where a thin gate oxide is to be formed.

Referring to FIG. 1, the conventional method of fabricating the dual gate oxide includes forming a first photoresist (PR) pattern P1 on the substrate 10 to cover the NMOS forming regions 11 and 12, forming N wells in the PMOS forming regions 13 and 14 using the first PR pattern P1 as a mask, and ion implanting an impurity 20 for controlling the threshold voltages into the N wells. After implanting the impurity 20, the first PR pattern P1 is removed.

Referring to FIG. 2, a second PR pattern P2 is formed on the substrate 10 to cover the PMOS forming regions 13 and 14. Then, P wells are formed in the NMOS forming regions 11 and 12 using the second PR pattern P2 as a mask. Next, an impurity 30 for controlling the threshold voltages is ion implanted into the P wells. After implanting the impurity 30, the second PR pattern P2 is removed.

Referring to FIG. 3, in order to implant an impurity 40 for controlling a threshold voltage into the first PMOS forming region 13, a third PR pattern P3 is formed on the substrate 10 for use as a mask during the impurity implantation. After the implantation of the impurity 40, the third PR pattern P3 is removed.

Referring to FIG. 4, in order to implant an impurity 50 for controlling a threshold voltage into the first NMOS forming region 11, a fourth PR pattern P4 is formed on the substrate 10 for use as a mask during the impurity implantation. After the implantation of the impurity 50, the fourth PR pattern P4 is removed.

Referring to FIG. 5, a first gate oxide 60 is formed over an entire surface of the substrate 10.

Referring to FIG. 6, a fifth PR pattern P5 is formed on the first gate oxide 60 over the second NMOS forming region 12 and the second PMOS forming region 14. The first gate oxide 60 over the first NMOS forming region 11 and the first PMOS forming region 13 is then etched using the fifth PR pattern P5 as a mask for removal.

Referring to FIG. 7, a second gate oxide 70 is formed on the substrate 10 and the first gate oxide 60 to cover the NMOS and PMOS forming regions 11, 12, 13, and 14. Resultantly, a dual gate oxide having both a thick gate oxide layer and a thin gate oxide layer is formed in a single chip.

As described above, the conventional process for fabricating the dual gate oxide involves various photolithographic etching steps, thereby making the process complex and costly.

SUMMARY OF THE INVENTION

The present invention is therefore directed to a method of fabricating a dual gate oxide, which substantially overcomes one or more of the problems due to the limitations and disadvantages of the related art.

It is a feature of an embodiment of the present invention to provide a simplified method of fabricating a dual gate oxide having dual thicknesses and dual threshold voltages.

It is another feature of an embodiment of the present invention to provide a method of fabricating a dual gate oxide having a reduced cost.

At least one of the above and other features and advantages of the present invention may be realized by providing a method of fabricating a dual gate oxide of a semiconductor device including forming a first gate insulation layer over an entire surface of a substrate, removing a portion of the first gate insulation layer to selectively expose a first region of the substrate using a first mask and performing an ion implantation on the selectively exposed first region of the substrate using the first mask, and forming a second gate insulation layer on the first gate insulation layer and the exposed first region of the substrate to form a resultant gate insulation layer having a first thickness over the first region of the substrate and a second thickness over a remaining region of the substrate, the first thickness and the second thickness being different.

The first thickness may be less than the second thickness. A portion of the resultant gate insulation layer having the first thickness may be a gate insulation layer of a transistor to which a first voltage is applied, and a portion of the resultant gate insulation layer having the second thickness may be a gate insulation layer of the transistor to which a second voltage is applied.

Exposing the first region of the substrate may further include forming a well in the first region of the substrate using the first mask.

The method may further include performing an ion implantation for controlling a threshold voltage on the entire surface of the substrate, before forming the first gate insulation layer. The method may further include forming a well region in the substrate using a mask used to perform the ion implantation for controlling the threshold voltage, before performing the ion implantation for controlling the threshold voltage.

Alternatively, the method may further include performing an ion implantation for controlling a threshold voltage on a portion of the substrate not including the first region of the substrate, before forming the first gate insulation layer. The method may further include forming a well region in the substrate using a mask used to perform the ion implantation for controlling the threshold voltage, before performing the ion implantation for controlling the threshold voltage.

At least one of the above and other features and advantages of the present invention may be realized by providing a method for fabricating a dual gate oxide of a semiconductor device including forming a well of a second conductivity type, using a first mask, on a region of a substrate where a metal oxide semiconductor (MOS) of a first conductivity type is to be formed, the second conductivity type being opposite to the first conductivity type, and adjusting a threshold voltage, forming a well of the first conductivity type, using a second mask, on a region of the substrate where a metal oxide semiconductor (MOS) of the second conductivity type is to be formed, and adjusting a threshold voltage, forming a first gate insulation layer having a first thickness over the entire surface of the substrate, exposing the substrate by removing the first gate insulation layer formed on a region of the MOS forming region of the first conductivity type where a second gate insulation layer having a second thickness different from the first thickness is to be formed using a third mask, and performing ion implantation for controlling a threshold voltage, exposing the substrate by removing the first gate insulation layer formed on a region of the MOS forming region of the second conductivity type where the second gate insulation layer having the second thickness different from the first thickness is to be formed using a fourth mask, and performing ion implantation for controlling a threshold voltage, and forming the second gate insulation layer on the exposed substrate.

The second thickness may be less than the first thickness.

The first gate insulation layer may be a gate insulation layer of a transistor to which a first voltage is applied, and the second gate insulation layer may be a gate insulation layer of a transistor to which a second voltage is applied.

At least one of the above and other features and advantages of the present invention may be realized by providing a method for fabricating a dual gate oxide of a semiconductor device including forming a well of a second conductivity type, using a first mask, on a region of a metal oxide semiconductor (MOS) of a first conductivity type of a substrate where a first gate insulation layer having a first thickness is to be formed, the second conductivity type being opposite to the first conductivity type, and adjusting a first threshold voltage, forming a well of the first conductivity type, using a second mask, on a region of the MOS forming region of the second conductivity type where the first gate insulation layer having the first thickness is to be formed, and adjusting the first threshold voltage, forming the first gate insulation layer having the first thickness over the entire surface of the substrate, exposing the substrate by removing the first gate insulation layer formed on a region of the MOS forming region of the second conductivity type where a second gate insulation layer having a second thickness different from the first thickness is to be formed using a third mask, forming the well of the second conductivity type and performing ion implantation for controlling a second threshold voltage, exposing the substrate by removing the first gate insulation layer formed on a region of the MOS forming region of the second conductivity type where the second gate insulation layer having the second thickness different from the first thickness is to be formed using a fourth mask, forming the well of the first conductivity type and performing ion implantation for controlling the second threshold voltage, and forming the second gate insulation layer on the exposed substrate.

The first threshold voltage may be lower than the second threshold voltage.

The second thickness may be less than the first thickness.

The first gate insulation layer may be a gate insulation layer of a transistor to which a first voltage is applied, and the second gate insulation layer may be a gate insulation layer of a transistor to which a second voltage is applied.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
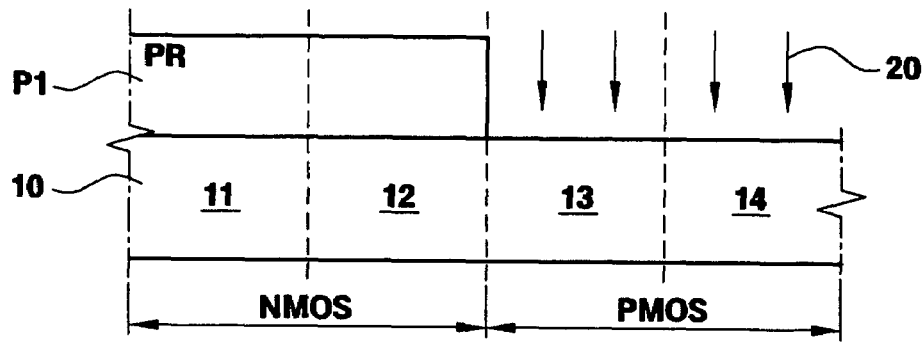
FIGS. 1 through 7 illustrate cross-sectional views of sequential stages in a conventional method of fabricating a dual gate oxide.
Figure 2:
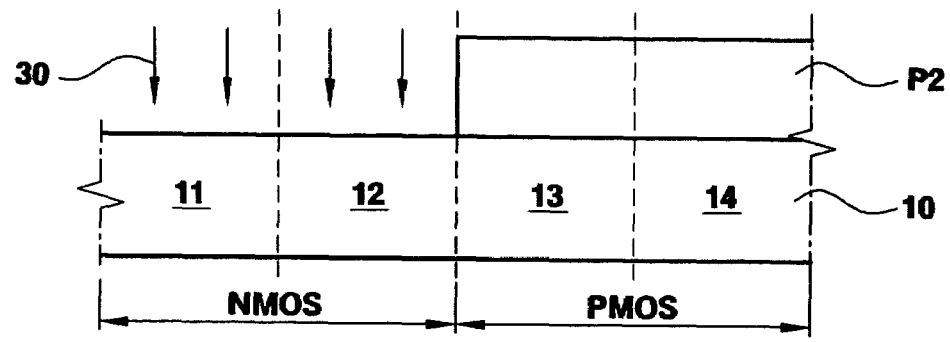
Figure 3:
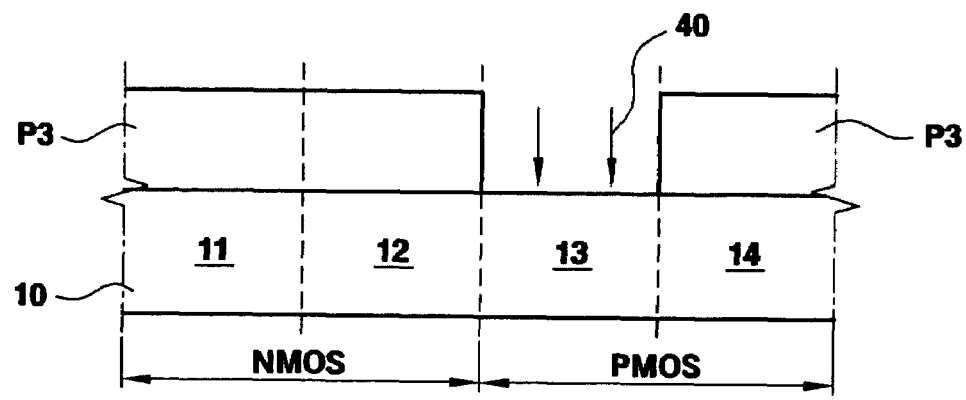
Figure 4:
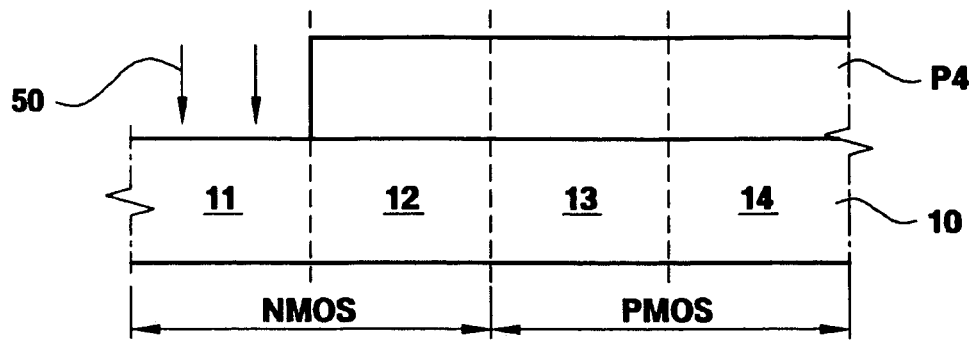
Figure 5:
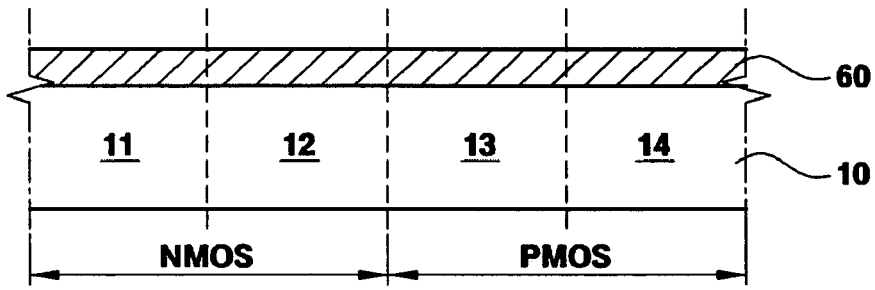
Figure 6:
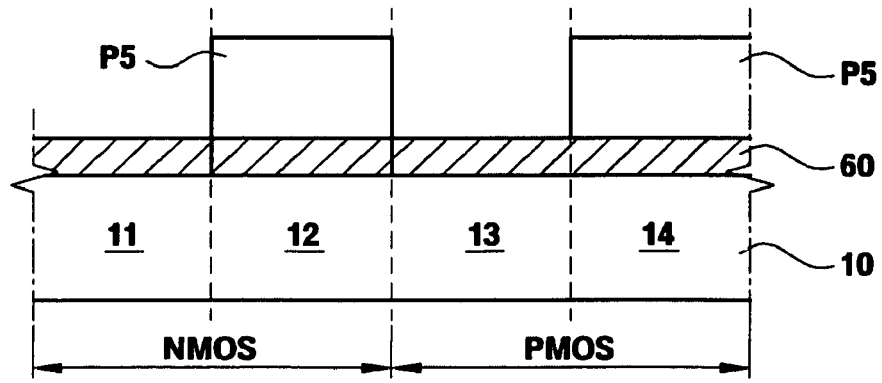
Figure 7:
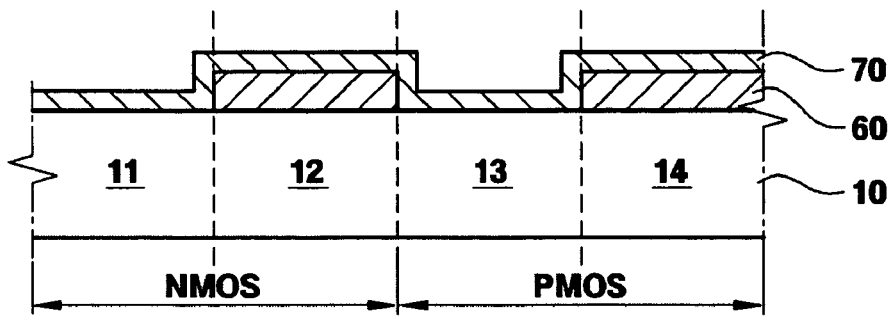

Korean Patent Application No. 10-2004-0007005, filed on Feb. 3, 2004, in the Korean Intellectual Property Office, and entitled: "Fabrication Method of a Dual Gate Oxide," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be, understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals and characters refer to like elements throughout.

A method of fabricating a dual gate oxide of a semiconductor device according to a first embodiment of the present invention will now be explained with reference to FIGS. 8 through 13.

FIGS. 8 through 13 illustrate cross-sectional views of sequential stages in a method of fabricating a dual gate oxide of a semiconductor device according to the first embodiment of the present invention.

Figure 8:
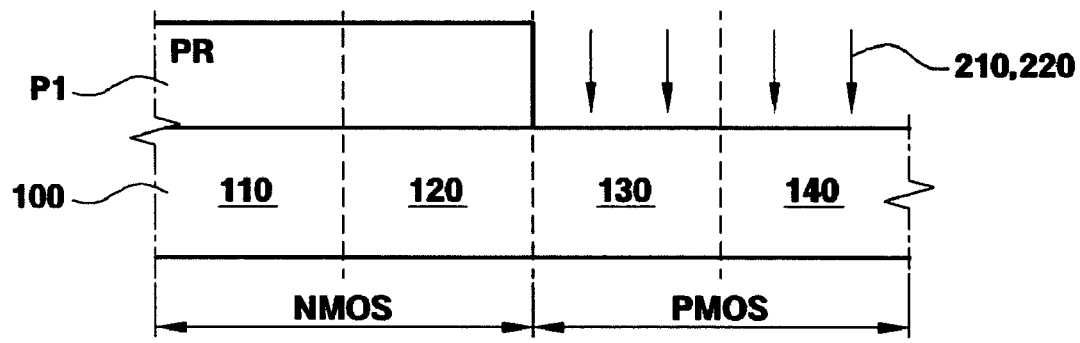
FIGS. 8 through 13 illustrate cross-sectional views of sequential stages in a method of fabricating a dual gate oxide of a semiconductor device according to a first embodiment of the present invention.

Referring to FIG. 8, a first photoresist (PR) is coated on a substrate 100 having NMOS forming regions 110 and 120 and PMOS forming regions 130 and 140. The first PR is then patterned by photolithography to form a first PR pattern P1 on the substrate 100 to cover the NMOS forming regions 110 and 120 and to expose the PMOS forming regions 130 and 140. A first conductivity type impurity 210 for forming an N well and a second conductivity type impurity 220 for controlling a threshold voltage (Vth) are sequentially implanted into the exposed PMOS forming regions 130 and 140 using the first PR pattern P1 as a mask.

The first conductivity type impurity 210 for forming the N well and the second conductivity type impurity 220 for controlling the threshold voltage (Vth) may be the same impurities of the same conductivity type, e.g., a N+ type, or different impurities of the N+ type. The first and second conductivity type impurities 210 and 220 are preferably implanted using an ion implantation technique. Here, an ion implantation energy of the first conductivity type impurity 210 is preferably higher than that of the second conductivity type impurity 220. In general, as implantation energy of a conductive impurity is higher, the ions are implanted at the comparatively much more deep position of a substrate. According to this, the conductive impurity implantation process for forming a well is to be performed with higher implantation energy and the conductive impurity implantation process for controlling a threshold voltage is to be performed with lower implantation energy. Since a variety of known ions may be used as N-type and P-type impurities, particular ions are not specifically identified herein and any suitable ion may be used provided it is appropriate as an N-type or P-type ion. Further, since the same N-type or P-type ions may be different in concentration by step, they are divided into first through eighth conductive impurities and then described herein.

After implanting the first and second conductivity type impurities 210 and 220, the first PR pattern P1 is removed, e.g., using an ashing and stripping process.

Figure 9:
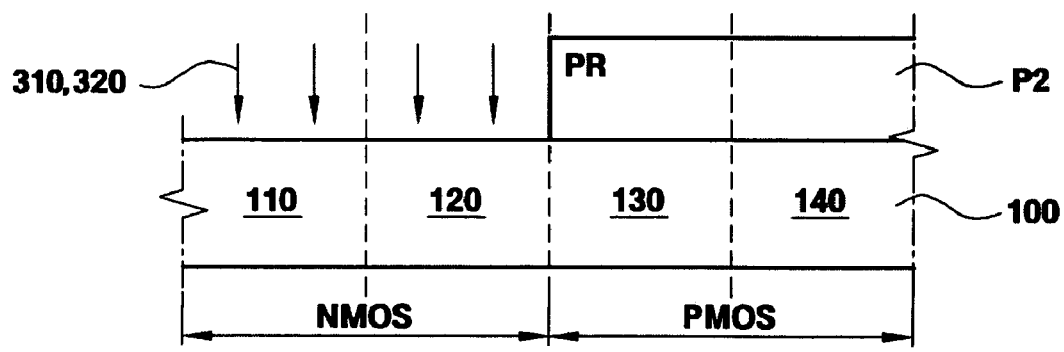

Referring to FIG. 9, a second PR is coated on the substrate 100. The second PR is then patterned by photolithography to form a second PR pattern P2 on the substrate 100 to cover the PMOS forming regions 130 and 140 and to expose the NMOS forming regions 110 and 120. A third conductivity type impurity 310 for forming a P well and a fourth conductivity type impurity 320 for controlling a threshold voltage (Vth) are sequentially implanted into the exposed NMOS forming regions 110 and 120 using the second PR pattern P2 as a mask.

The third conductivity type impurity 310 for forming the P well and the fourth conductivity type impurity 320 for controlling a threshold voltage (Vth) may be the same impurities of the same conductivity type, e.g., a P+ type, or different impurities of the P+ type. The third and fourth conductivity type impurities 310 and 320 are preferably implanted using an ion implantation technique. Here, an ion implantation energy of the third conductivity type impurity 310 is preferably higher than that of the fourth conductivity type impurity 320.

After implanting the third and fourth conductivity type impurities 310 and 320, the second PR pattern P2 is removed, e.g., using an ashing and stripping process.

Figure 10:
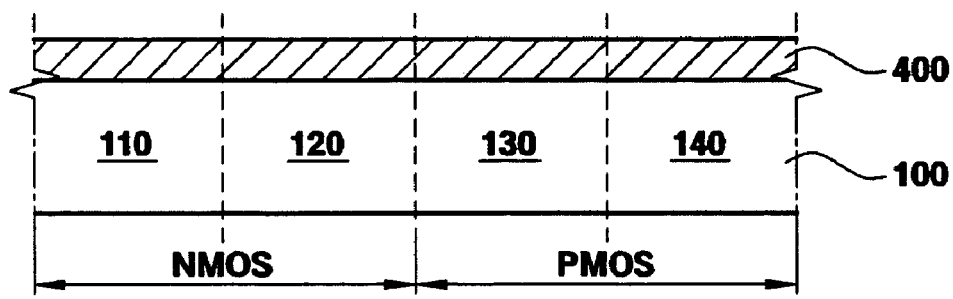

Referring to FIG. 10, a first gate insulation layer 400, e.g., a gate oxide, is grown and formed on the substrate 100 by oxidation.

Figure 11:
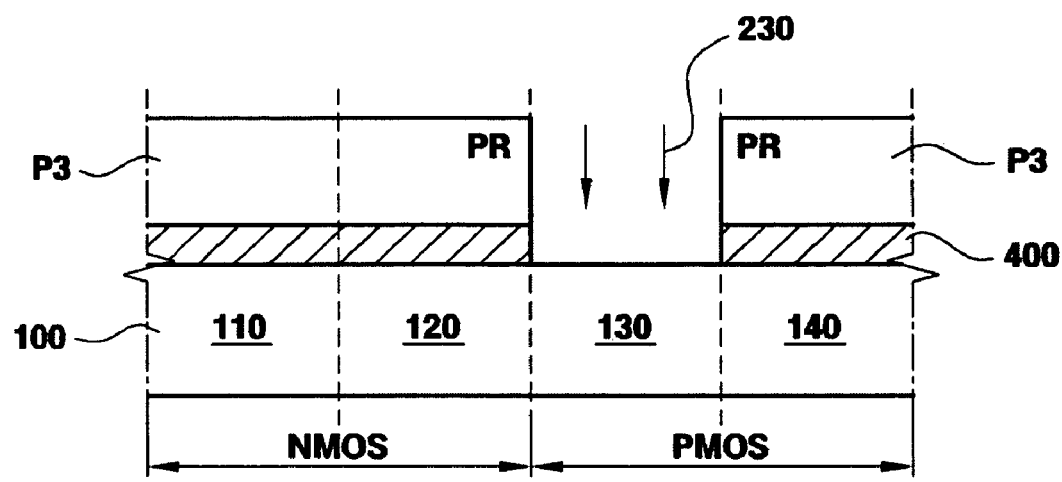

Referring to FIG. 11, a third PR is coated on the first gate oxide 400. The third PR is patterned by photolithography to form a third PR pattern P3 on the first gate oxide 400. The third PR pattern P3 covers the first gate oxide 400 over the first and second NMOS forming regions 110 and 120 and the first gate oxide 400 over the second PMOS forming region 140 and exposes the gate oxide over the first PMOS forming region 130. The first gate oxide 400 over the exposed first PMOS forming region 130 is then removed using the third PR pattern P3 as an etching mask.

Subsequently, a fifth conductivity type impurity 230 for controlling a threshold voltage (Vth) is implanted using the third PR pattern P3 as a mask. The fifth conductivity type impurity 230 is preferably the same material as the second conductivity type impurity 220. As a result of the implantation of the fifth conductivity type impurity 230, the first PMOS forming region 130 and the second PMOS forming region 140 have different threshold voltages. The fifth conductivity type impurity 230 is preferably implanted using an ion implantation technique.

More specifically, the third PR pattern P3 is used as an etch mask for etching the first gate oxide 400 over the first PMOS forming region 130 and as an implant mask for implanting the fifth conductivity type impurity 230 into the first PMOS forming region 130 to make the threshold voltages of the first and second PMOS forming regions 130 and 140 different from one another.

In the first embodiment of the present invention, the first gate oxide 400 over the first PMOS forming region 130 is removed using the third PR pattern P3 as a mask. Subsequently, implantation of the fifth conductivity type impurity 230 is performed. Alternatively, implantation of the fifth conductivity type impurity 230 may be performed using the third PR pattern P3 as a mask prior to the removal of the first gate oxide 400 over the first PMOS forming region 130.

After implanting the fifth conductivity type impurity 230, the third PR pattern P3 is removed, e.g., using an ashing and stripping process.

Figure 12:
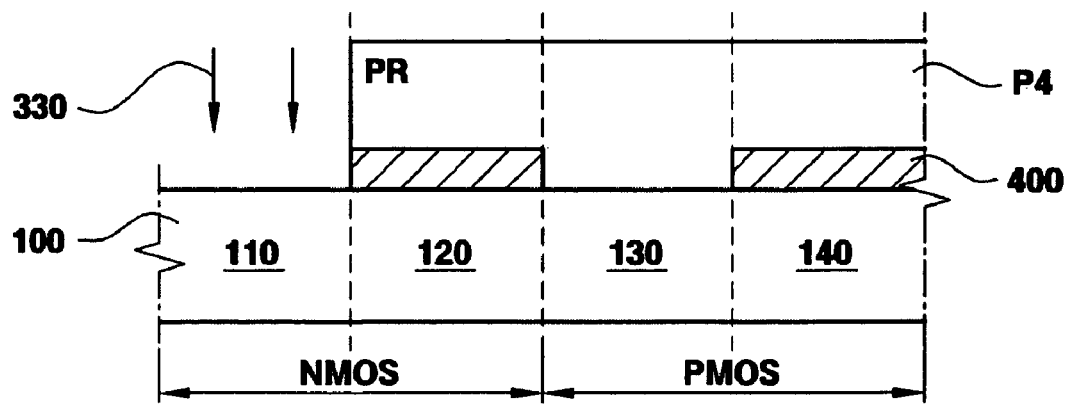

Referring to FIG. 12, a fourth PR is coated on the substrate 100 having the first gate oxide 400 and the exposed first PMOS forming region 130. The fourth PR is then pattered by photolithography to form a fourth PR pattern P4 on the substrate 100. The fourth PR pattern P4 covers the first gate oxide 400 over the second NMOS forming region 120 and the second PMOS forming region 140, covers the exposed first PMOS forming region 130, and exposes the first gate oxide 400 over the first NMOS forming region 110. The first gate oxide 400 over the exposed first NMOS forming region 110 is then removed using the fourth PR pattern P4 as an etching mask.

Subsequently, a sixth conductivity type impurity 330 for controlling a threshold voltage (Vth) is implanted using the fourth PR pattern P4 as a mask. The sixth conductivity type impurity 330 is preferably the same material as the fourth conductivity type impurity 320. As a result of implanting the sixth conductivity type impurity 330, the first NMOS forming region 110 and the second NMOS forming region 120 have different threshold voltages. The sixth conductivity type impurity 330 is preferably implanted using an ion implantation technique.

More specifically, the fourth PR pattern P4 is used both as an etch mask for etching the first gate oxide 400 over the first NMOS forming region 110 and as an implant mask for implanting the sixth conductivity type impurity 330 into the first NMOS forming region 110 to make the threshold voltages of the first and second NMOS forming regions 110 and 120 different from one another.

In the first embodiment of the present invention, the first gate oxide 400 over the first NMOS forming region 110 is removed using the fourth PR pattern P4 as a mask. Subsequently, implantation of the sixth conductivity type impurity 330 is performed. Alternatively, implantation of the sixth conductivity type impurity 330 may be performed using the fourth PR pattern P4 as a mask prior to removal of the first gate oxide 400 over the first NMOS forming region 110.

After implanting the sixth conductivity type impurity 330, the fourth PR pattern P4 is removed, e.g., using an ashing and stripping process.

Figure 13:
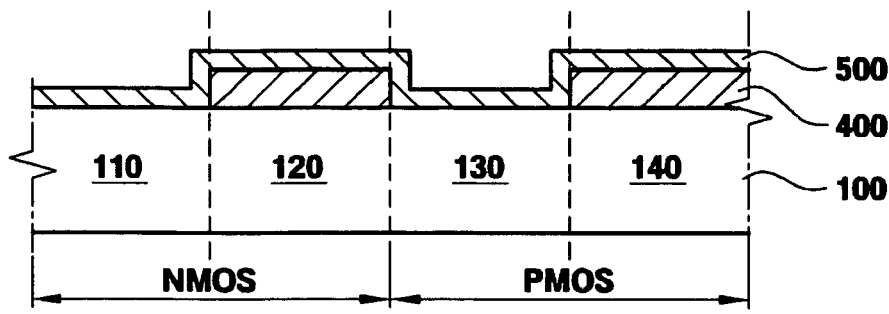

Referring to FIG. 13, after removing the fourth PR pattern P4, a second gate insulation layer 500, e.g., a gate oxide, is grown and formed by oxidation on the substrate 100 over the first NMOS forming region 110 and the first PMOS forming region 130 and on the first gate oxide 400 over the second NMOS forming region 120 and the second PMOS forming region 140.

Resultantly, oxide layers having different thicknesses are formed, thereby forming a dual gate oxide on a single chip.

In the dual gate oxide, a thinner gate oxide region and a thicker gate oxide region can be used as a low voltage region and a high voltage region, respectively.

Since the thin gate oxide region has a significantly lower threshold voltage than a threshold voltage required by a low-voltage MOS device, additional impurities for increasing a threshold voltage are implanted to a region where a thin gate oxide is to be formed using the third PR pattern P3 and the fourth PR pattern P4 during etching of the first gate oxide 400 using the same PR patterns P3 and P4 as etch masks, thereby attaining an appropriate threshold voltage for a low-voltage MOS device.

According to the method of the first embodiment of the present invention, during the formation of a dual gate oxide on a single chip, a single mask is used both in etching a first gate oxide to make a resultant gate oxide have dual thicknesses and in implanting an impurity to make the resultant gate oxide have dual threshold voltages. Therefore, the number of masks required for fabrication of a dual gate oxide is reduced, thereby simplifying the fabrication process and reducing the fabrication cost.

A method of fabricating a dual gate oxide of a semiconductor device according to the second embodiment of the present invention will now be explained with reference to FIGS. 14 through 19.

FIGS. 14 through 19 illustrate cross-sectional views of sequential stages in a method of fabricating a dual gate oxide of a semiconductor device according to the second embodiment of the present invention.

Figure 14:
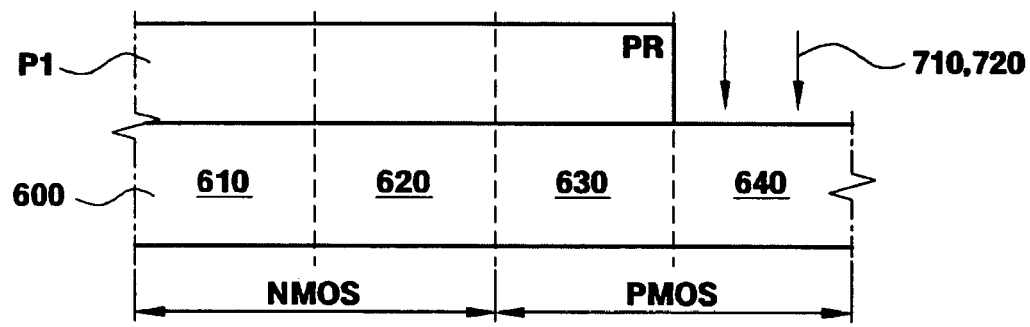
FIGS. 14 through 19 illustrate cross-sectional views of sequential stages in a method of fabricating a dual gate oxide of a semiconductor device according to a second embodiment of the present invention.

Referring to FIG. 14, a first photoresist (PR) is coated on a substrate 600 having first and second NMOS forming regions 610 and 620 and first and second PMOS forming regions 630 and 640. The first PR is patterned by photolithography to form a first PR pattern P1 on the substrate 600. The first PR pattern P1 covers the first and second NMOS forming regions 610 and 620 and the first PMOS forming region 630 and exposes the second PMOS forming region 640.

A first conductivity type impurity 710 for forming an N well and a second conductivity type impurity 720 for controlling a threshold voltage (Vth) are sequentially implanted into the exposed second PMOS forming region 640 using the first PR pattern P1 as a mask.

The first conductivity type impurity 710 for forming the N well and the second conductivity type impurity 720 for controlling the threshold voltage (Vth) may be the same impurities of the same conductivity type, e.g., a N+ type, or different impurities of the N+ type. The first and second conductivity type impurities 710 and 720 are preferably implanted using an ion implantation technique. Here, an ion implantation energy of the first conductivity type impurity 710 is preferably higher than that of the second conductivity type impurity 720.

After implanting the first and second conductivity type impurities 710 and 720, the first PR pattern P1 is removed, e.g., using an ashing and stripping process.

Figure 15:
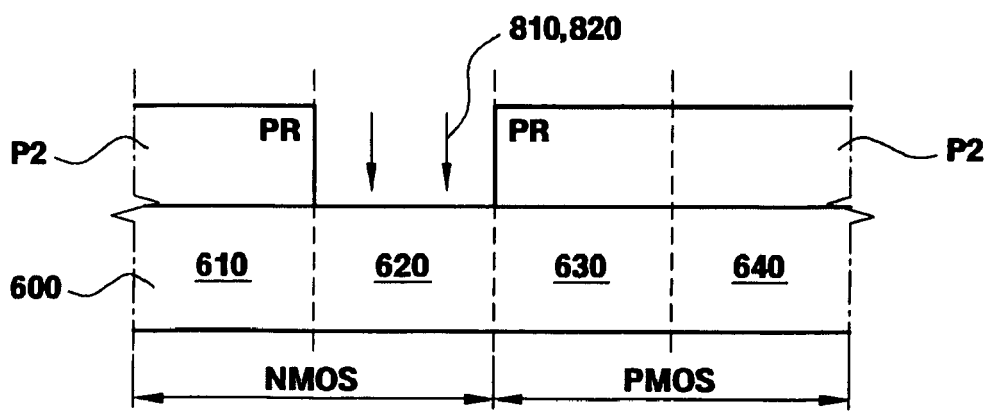

Referring to FIG. 15, a second PR is coated on the substrate 600. The second PR is then patterned by photolithography to form a second PR pattern P2 on the substrate 600. The second PR pattern P2 covers the first and second PMOS forming regions 630 and 640 and the first NMOS forming region 610 and exposes the second NMOS forming region 620. A third conductivity type impurity 810 for forming a P well and a fourth conductivity type impurity 820 for controlling a threshold voltage (Vth) are sequentially implanted into the exposed second NMOS forming region 620 using the second PR pattern P2 as a mask.

The third conductivity type impurity 810 for forming the P well and the fourth conductivity type impurity 820 for controlling the threshold voltage (Vth) may be the same impurities of the same conductivity type, e.g., a P+ type, or different impurities of the P+ type. The third and fourth conductivity type impurities 810 and 820 are preferably implanted using an ion implantation technique. Here, an ion implantation energy of the third conductivity type impurity 810 is preferably higher than that of the fourth conductivity type impurity 820.

After implanting the third and fourth conductivity type impurities 810 and 820, the second PR pattern P2 is removed, e.g., using an ashing and stripping process.

Figure 16:
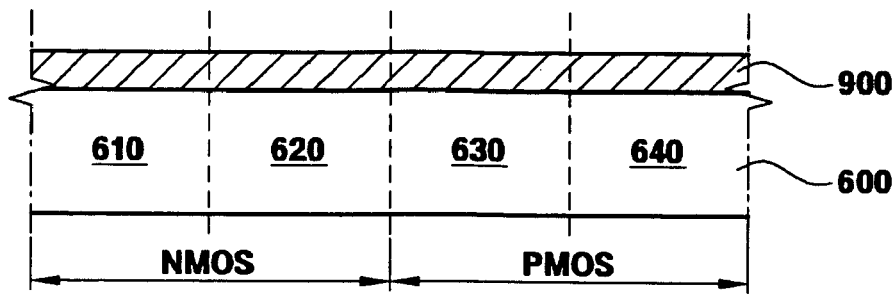

Referring to FIG. 16, a first gate insulation layer 900, e.g., a gate oxide, is grown and formed by oxidation on the substrate 600.

Figure 17:
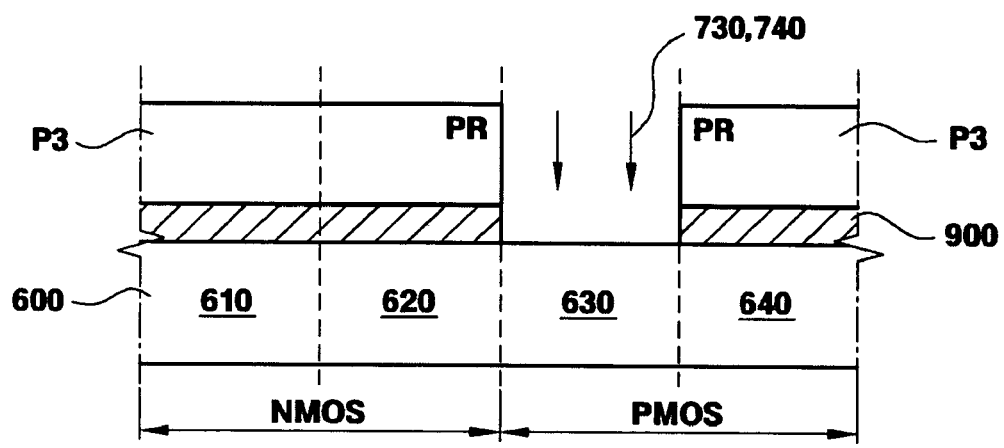

Referring to FIG. 17, a third PR is coated on the first gate oxide 900. The third PR is then pattered by photolithography to form a third PR pattern P3. The third PR pattern P3 covers the first gate oxide 900 over the first and second NMOS forming regions 610 and 620 and the first gate oxide 900 over the second PMOS forming region 640 and exposes the first gate oxide 900 over the first PMOS forming region 630. The first gate oxide 900 over the exposed first PMOS forming region 630 is then removed using the third PR pattern P3 as an etch mask.

Subsequently, a fifth conductivity type impurity 730 for forming an N well and an sixth conductivity type impurity 740 for controlling a threshold voltage (Vth) are sequentially implanted using the third PR pattern P3 as a mask.

The fifth conductivity type impurity 730 is preferably the same material as the first conductivity type impurity 710 and is implanted at the same dose as that of the first conductivity type impurity 710. The sixth conductivity type impurity 740 is preferably the same material as the second conductivity type impurity 720 and is implanted at a dose different from that of the second conductivity type impurity 720. As a result of this implantation, the first PMOS forming region 630 and the second PMOS forming region 640 have different threshold voltages. The fifth and sixth conductivity type impurities 730 and 740 are preferably implanted using an ion implantation technique.

More specifically, the third PR pattern P3 is used both as an etch mask for etching the first gate oxide 900 over the first PMOS forming region 630 and as an implant mask for implanting the fifth and sixth conductivity type impurities 730 and 740 into the first PMOS forming region 630.

In the second embodiment of the present invention, the first gate oxide 900 over the first PMOS forming region 630 is removed using the third PR pattern P3 as a mask. Subsequently, implantation of the fifth and sixth conductivity type impurities 730 and 740 is performed. Alternatively, implantation of the fifth and sixth conductivity type impurities 730 and 740 may be performed using the third PR pattern P3 as a mask prior to the removal of the first gate oxide 900 over the first PMOS forming region 630.

After implanting the fifth and sixth conductivity type impurities 730 and 740, the third PR pattern P3 is removed, e.g., using an ashing and stripping process.

Figure 18:
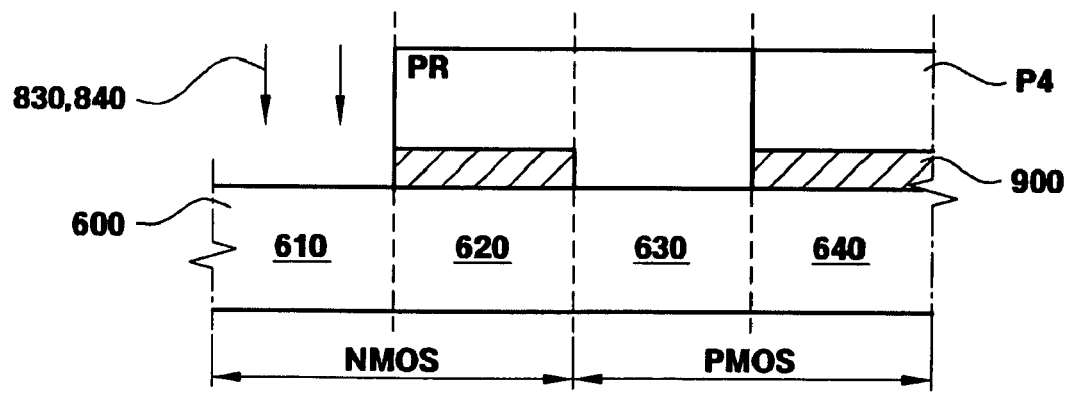

Referring to FIG. 18, a fourth PR is coated on the substrate 600 having the first gate oxide 900 and the exposed first PMOS forming region 630. The fourth PR is then pattered by photolithography to form a fourth PR pattern P4 on the substrate 600. The fourth PR pattern P4 covers the first gate oxide 900 over the second NMOS forming region 620 and the second PMOS forming region 640, covers the exposed first PMOS forming region 630, and exposes the first gate oxide 900 over the first NMOS forming region 610. The first gate oxide 900 over the exposed first NMOS forming region 610 is then removed using the fourth PR pattern P4 as an etching mask.

Subsequently, a seventh conductivity type impurity 830 for forming a P well and an eighth conductivity type impurity 840 for controlling a threshold voltage (Vth) are sequentially implanted using the fourth PR pattern P4 as a mask.

The seventh conductivity type impurity 830 is preferably the same material as the third conductivity type impurity 810 and is implanted at the same dose as that of the third conductivity type impurity 810. The eighth conductivity type impurity 840 is preferably the same material as the fourth conductivity type impurity 820 and is implanted at a dose different from that of the fourth conductivity type impurity 820. As a result of this implantion, the first NMOS forming region 610 and the second NMOS forming region 620 have different threshold voltages. The seventh and eighth conductivity type impurities 830 and 840 are preferably implanted using an ion implantation technique.

More specifically, the fourth PR pattern P4 is used both as an etch mask for etching the first gate oxide 900 over the first NMOS forming region 610 and as an implant mask for implanting the seventh and eighth conductivity type impurities 830 and 840 into the first NMOS forming region 610.

In the second embodiment of the present invention, the first gate oxide 900 over the first NMOS forming region 610 is removed using the fourth PR pattern P4 as a mask. Subsequently, implantation of the seventh and eighth conductivity type impurities 830 and 840 is performed. Alternatively, implantation of the seventh and eighth conductivity type impurities 830 and 840 may be performed using the fourth PR pattern P4 as a mask prior to the removal of the first gate oxide 900 over the first NMOS forming region 610.

After implanting the seventh and eighth conductivity type impurities 830 and 840, the fourth PR pattern P4 is removed, e.g., using an ashing and stripping process.

Figure 19:
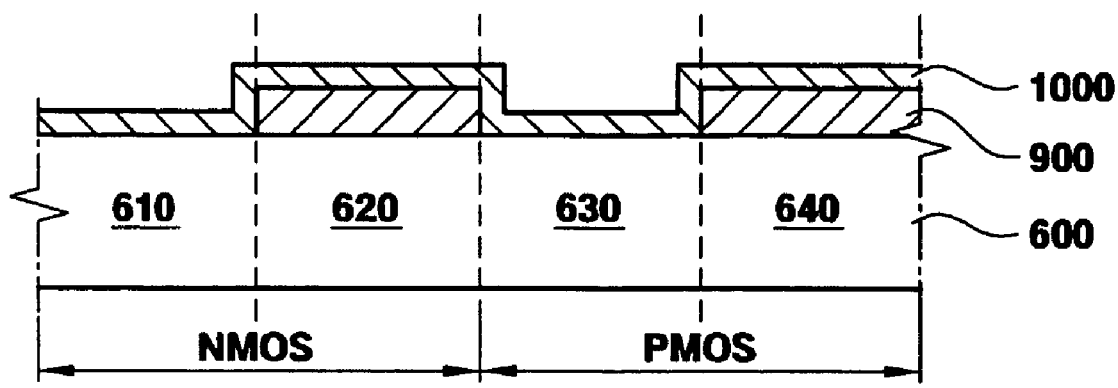

Referring to FIG. 19, after removing the fourth PR pattern P4, a second gate insulation layer 1000, e.g., a gate oxide, is grown and formed by oxidation on the substrate 600 over the first NMOS forming region 610 and the first PMOS forming region 630 and one the first gate oxide 900 over the second NMOS forming region 620 and the second PMOS forming region 640.

Resultantly, oxide layers having different thicknesses are formed, thereby forming a dual gate oxide on a single chip.

In the dual gate oxide, a thinner gate oxide region and a thicker gate oxide region can be used as a low voltage region and a high voltage region, respectively.

Since the thin gate oxide region has a significantly lower threshold voltage than a threshold voltage required by a low-voltage MOS device, impurities are implanted thereto in a larger dose than that implanted to a thick gate oxide region, thereby attaining an appropriate threshold voltage for a low-voltage MOS device.

More specifically, during the etching of the first gate oxide 900 using the third and fourth PR patterns P3 and P4, impurities are implanted into a thin gate oxide region and a thick gate oxide region in different doses using the same PR patterns P3 and P4, thereby adjusting threshold voltages corresponding to the respective regions.

Therefore, the second embodiment of the present invention has the same effects as those of the first embodiment.

As described above, according to the method of the second embodiment of the present invention, during the formation of a dual gate oxide on a single chip, a single mask is used both in etching a first gate oxide to make a resultant gate oxide have dual thicknesses and in implanting an impurity to make the resultant gate oxide have dual threshold voltages, thereby simplifying the fabrication process and reducing the fabrication cost.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a dual gate oxide of a semiconductor device, comprising:

forming a first gate insulation layer over an entire surface of a substrate;

removing a portion of the first gate insulation layer to selectively expose a first region of the substrate using a first mask and performing an ion implantation on the selectively exposed first region of the substrate using the first mask; and forming a second gate insulation layer on the first gate insulation layer and the exposed first region of the substrate to form a resultant gate insulation layer having a first thickness over the first region of the substrate and a second thickness over a remaining region of the substrate, the first thickness and the second thickness being different.

2. The method as claimed in claim 1, wherein the first thickness is less than the second thickness.

3. The method as claimed in claim 1, wherein a portion of the resultant gate insulation layer having the first thickness is a gate insulation layer of a transistor to which a first voltage is applied, and a portion of the resultant gate insulation layer having the second thickness is a gate insulation layer of the transistor to which a second voltage is applied.

4. The method as claimed in claim 1, wherein exposing the first region of the substrate further comprises forming a well in the first region of the substrate using the first mask.

5. The method as claimed in claim 1, further comprising performing an ion implantation for controlling a threshold voltage on the entire surface of the substrate, before forming the first gate insulation layer.

6. The method as claimed in claim 1, further comprising performing an ion implantation for controlling a threshold voltage on a portion of the substrate not including the first region of the substrate, before forming the first gate insulation layer.

7. The method as claimed in claim 5, further comprising forming a well region in the substrate using a mask used to perform the ion implantation for controlling the threshold voltage, before performing the ion implantation for controlling the threshold voltage.

8. The method as claimed in claim 6, further comprising forming a well region in the substrate using a mask used to perform the ion implantation for controlling the threshold voltage, before performing the ion implantation for controlling the threshold voltage.

9. A method for fabricating a dual gate oxide of a semiconductor device, comprising:
forming a well of a second conductivity type, using a first mask, on a region of a substrate where a metal oxide semiconductor (MOS) device of a first conductivity type is to be formed, the second conductivity type being opposite to the first conductivity type, and adjusting a first threshold voltage;
forming a well of the first conductivity type, using a second mask, on a region of the substrate where a metal oxide semiconductor (MOS) device of the second conductivity type is to be formed, and adjusting the first threshold voltage;
forming a first gate insulation layer having a first thickness over the entire surface of the substrate;
exposing the substrate by removing the first gate insulation layer formed on a region of the MOS device forming region of the first conductivity type where a second gate insulation layer having a second thickness different from the first thickness is to be formed using a third mask, and performing ion implantation for controlling a second threshold voltage;
exposing the substrate by removing the first gate insulation layer formed on a region of the MOS device forming region of the second conductivity type where the second gate insulation layer having the second thickness different from the first thickness is to be formed using a fourth mask, and performing ion implantation for controlling the second threshold voltage; and
forming the second gate insulation layer on the exposed substrate.

10. The method as claimed in claim 9, wherein the second thickness is less than the first thickness.

11. The method as claimed in claim 9, wherein the first gate insulation layer is a gate insulation layer of a transistor to which a first voltage is applied, and the second gate insulation layer is a gate insulation layer of a transistor to which a second voltage is applied.

12. A method for fabricating a dual gate oxide of a semiconductor device, comprising:
forming a well of a second conductivity type, using a first mask, on a region of a metal oxide semiconductor (MOS) device of a first conductivity type of a substrate where a first gate insulation layer having a first thickness is to be formed, the second conductivity type being opposite to the first conductivity type, and adjusting a first threshold voltage;
forming a well of the first conductivity type, using a second mask, on a region of the MOS device forming region of the second conductivity type where the first gate insulation layer having the first thickness is to be formed, and adjusting the first threshold voltage;
forming the first gate insulation layer having the first thickness over the entire surface of the substrate;
exposing the substrate by removing the first gate insulation layer formed on a region of the MOS device forming region of the second conductivity type where a second gate insulation layer having a second thickness different from the first thickness is to be formed using a third mask, forming the well of the second conductivity type and performing ion implantation for controlling a second threshold voltage;
exposing the substrate by removing the first gate insulation layer formed on a region of the MOS device forming region of the second conductivity type where the second gate insulation layer having the second thickness different from the first thickness is to be formed using a fourth mask, forming the well of the first conductivity type and performing ion implantation for controlling the second threshold voltage; and
forming the second gate insulation layer on the exposed substrate.

13. The method as claimed in claim 12, wherein the first threshold voltage is lower than the second threshold voltage.

14. The method as claimed in claim 12, wherein the second thickness is less than the first thickness.

15. The method as claimed in claim 12, wherein the first gate insulation layer is a gate insulation layer of a transistor to which a first voltage is applied, and the second gate insulation layer is a gate insulation layer of a transistor to which a second voltage is applied.

16. The method as claimed in claim 9, wherein the first mask exposes a portion of the region of the substrate where the MOS device of the first conductivity type is to be formed.

17. The method as claimed in claim 9, wherein the second mask exposes a portion of the region of the substrate where the MOS device of the second conductivity type is to be formed.

18. The method as claimed in claim 9, wherein the first mask exposes an entirety of the region of the substrate where the MOS device of the first conductivity type is to be formed.

19. The method as claimed in claim 9, wherein the second mask exposes an entirety of the region of the substrate where the MOS device of the second conductivity type is to be formed.

* * * * *